(12) United States Patent
Chang et al.

(10) Patent No.: US 8,017,460 B2
(45) Date of Patent: Sep. 13, 2011

(54) METHOD OF MANUFACTURING FLAT PANEL DISPLAY

(75) Inventors: Shu-Yu Chang, Hsinchu County (TW); Wen-Hsiung Liu, Pingtung County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 12/824,580

(22) Filed: Jun. 28, 2010

(65) Prior Publication Data

US 2010/0273283 A1   Oct. 28, 2010

Related U.S. Application Data

(62) Division of application No. 12/285,641, filed on Oct. 10, 2008, now Pat. No. 7,772,050.

(30) Foreign Application Priority Data

Oct. 30, 2007 (TW) .............................. 96140774 A

(51) Int. Cl.
*H01L 21/00* (2006.01)
(52) U.S. Cl. .......... 438/149; 438/30; 438/708; 438/947; 257/E21.023; 257/E21.027; 257/E21.259
(58) Field of Classification Search .................. 438/707, 438/709; 257/E21.023, E21.487, E21.492
See application file for complete search history.

(56) References Cited

U.S. PATENT DOCUMENTS

| | | | |
|---|---|---|---|
| 6,531,392 B2* | 3/2003 | Song et al. ..................... | 438/648 |
| 2004/0183084 A1* | 9/2004 | Wachi .............................. | 257/98 |
| 2005/0189578 A1* | 9/2005 | Seo et al. ........................ | 257/306 |
| 2008/0169470 A1* | 7/2008 | Lim et al. ........................ | 257/59 |

* cited by examiner

*Primary Examiner* — Cheung Lee
(74) *Attorney, Agent, or Firm* — Bacon & Thomas, PLLC

(57) ABSTRACT

The present invention relates to a method for manufacturing a flat panel display. Herein, the same mask is used to form contact holes and pixel electrodes in the display substrate. Hence, the number of masks needed for manufacturing the flat panel display can be reduced to decrease the manufacturing cost.

9 Claims, 5 Drawing Sheets

METHOD OF MANUFACTURING FLAT PANEL DISPLAY

This application is a Divisional of application Ser. No. 12/285,641 filed on Oct. 10, 2008, the entire disclosure of which is herein incorporated by reference.

BACKGROUND OF THE INVENTION

1. Field of the Invention

The present invention relates to a method for manufacturing a flat panel display and, more particularly, to a method for manufacturing a flat panel display using fewer masks in comparison to a conventional method.

2. Description of Related Art

Currently, a thin film transistor liquid crystal display (TFT-LCD) is manufactured by employing five mask steps to form a gate metal layer, a semiconductor layer, a source/drain metal layer, contact holes and pixel electrodes, respectively. Herein, the contact holes function as holes in a dielectric layer to allow the electrical connection between the source/drain metal layer and the pixel electrodes.

FIGS. 1A to 1H show a conventional process for manufacturing a liquid crystal display. With reference to FIG. 1A, there is shown a conventional process for manufacturing contact holes (not shown in FIG. 1A) by a fourth mask. A display substrate 1 is first manufactured by employing several mask steps. Herein, a pattern of a source/drain metal layer 14 is formed on a glass substrate 11 by a third mask (not shown in FIG. 1A), and then a dielectric layer 15 is formed on the surface of the glass substrate 11 to protect the circuit structure there below. Subsequently, a photoresist layer 16 is coated on the dielectric layer 15. The photoresist layer 16 is a positive photoresist that can be removed by a developer after the absorption of light energy. After the display substrate 1 is accomplished, the display substrate 1 undergoes an exposure process by a light source 3 and a fourth mask 2. The aforementioned fourth mask 2 comprises a transparent quartz substrate 21 and a chromium film 22 disposed on the transparent quartz substrate 21. The region not covered by the chromium film 22 defines the patterns of the contact holes. When the light source 3 is shone on the fourth mask 2, part of available light cannot pass through the region covered by the chromium film 22 but can pass the region not covered by the chromium film 22. Thereby, the light is not shone on the A region of the photoresist layer 16 corresponding to the region covered by the chromium film 22 of the fourth mask 2 but is shone on the B region of the photoresist layer 16 corresponding to the region not covered by the chromium film 22 of the fourth mask 2.

With reference to FIG. 1B, there is shown a display substrate 1 after completion of the aforementioned exposure process and then a soaking process is carried out in a developer (not shown in FIG. 1B). As shown in FIG. 1B, the developer removes only the B region of the photoresist layer 16 and the A region of the photoresist layer 16 is retained.

With reference to FIG. 1C, there is shown a display substrate 1 after completion of the aforementioned development process and then a soaking process is carried out in an etching liquid (not shown in FIG. 1C) for a period of time to form contact holes 151 and 152. The part of the dielectric layer 15 covered by the photoresist layer 16 (i.e. the A region of the dielectric layer 15) is protected from being etched. Thereby, only the B region of the dielectric layer 15 and/or the insulating layer 13 is removed by the etching liquid so as to expose the source/drain metal layer 14 and the gate metal layer 12.

With reference to FIG. 1D, there is shown a display substrate 1 after completion of the aforementioned etching process and then a process is carried out for removing the photoresist layer 16 shown in FIG. 1C.

With reference to FIG. 1E, there is shown a conventional process for manufacturing pixel electrodes by utilizing a fifth mask. After the photoresist layer 16 is removed, a pixel electrode layer 17 is formed on the display substrate 1 by physical vapor deposition. Generally, the material of the pixel electrode layer 17 is indium titanium oxide (ITO). Hereafter, a photoresist layer 18 is formed by coating. Herein, the pixel electrode layer 17 electrically connects to the source/drain metal layer 14 and the gate metal layer 12 directly. The following exposure process is similar to that shown in FIG. 1A, except that the mask shown in FIG. 1E is a fifth mask 4, the pattern of the chromium film 42 on the transparent quartz substrate 41 defines the patterns of the pixel electrodes, and the D region of the photoresist layer 18 corresponding to the region not covered by the chromium film 42 can absorb light energy.

With reference to FIG. 1F, there is shown a display substrate 1 after completion of the exposure process by the fifth mask and then a soaking process is carried out in a developer (not shown in FIG. 1F). As shown in FIG. 1F, the developer removes only the D region of the photoresist layer 18 and the C region of the photoresist layer 18 is retained.

With reference to FIG. 1G, there is shown a display substrate 1 after completion of the aforementioned exposure process shown in FIG. F and then a soaking process is carried out in an etching liquid (not shown in FIG. 1G) for a period of time. As shown in FIG. 1G, the D region of the pixel electrode layer 17 is removed.

With reference to FIG. 1H, there is shown a display substrate 1 after completion of the etching process shown in FIG. 1G and then a process is carried out for thoroughly removing the photoresist layer 18 shown in FIG. 1G. So far, the conventional process can accomplish the manufacture of the contact holes 151, 152 and the pixel electrodes 171, 172.

However, the increase in the size of a liquid crystal device results in the corresponding rise of the cost involved in the masks. If a liquid crystal display is manufactured by a conventional method, the cost incurred in the masks cannot be reduced due to the requirement of five masks and thus the manufacturing cost of the liquid crystal display is high. Thereby, the manufacturing time and cost can be reduced by lessening the number of masks used in the process for manufacturing a liquid crystal display.

SUMMARY OF THE INVENTION

An object of the present invention is to provide a method for manufacturing a flat panel display, where the number of masks used for manufacturing the flat panel display is lessened.

Another object of the present invention is to provide a method for manufacturing another flat panel display at lower cost than the conventional method.

The present invention provides a method for manufacturing a flat panel display, which can be employed on a display substrate comprising a metal layer, a dielectric layer and an insulating layer disposed between the metal layer and the dielectric layer. The aforementioned method comprises the following steps: forming a first photoresist layer on the display substrate; performing a first exposure process on the first photoresist layer by a mask to define a first region, a second region and a third region on the display substrate; removing part of the first photoresist layer in the first region; etching part of the dielectric layer in the first region; removing the first photoresist layer; forming an electrode layer on the display substrate; forming a second photoresist layer on the electrode layer; performing a second exposure process on the second photoresist layer by the mask; removing part of the second photoresist layer in the third region; etching part of the electrode layer in the third region; and removing the remained second photoresist layer.

In the present invention, the aforementioned method can further comprise a step for removing part of the insulating layer in the first region to form a contact hole before removing the first photoresist layer.

The present invention provides another method for manufacturing a flat panel display, which can be employed on a display substrate comprising a metal layer, a dielectric layer and an insulating layer disposed between the metal layer and the dielectric layer. The aforementioned method comprises the following steps: forming a photoresist layer on the display substrate; performing a first exposure process on the photoresist layer by a mask to define a first region, a second region and a third region on the display substrate; removing part of the photoresist layer in the first region; etching part of the dielectric layer in the first region; removing part of the photoresist layer in the second region; forming an electrode layer on the display substrate; and removing the remained photoresist layer.

In the present invention, the aforementioned method can further comprise a step for removing part of the insulating layer in the first region to form a contact hole before removing part of the photoresist layer in the second region.

The aforementioned mask can be a gray scale mask, such as a halftone mask, a thin layer coating mask or others. The mask can comprise a substrate, a first material layer and a second material layer. The substrate can be a quartz substrate, and the first material layer and the second material layer are disposed on the substrate to define a fourth region, a fifth region and a sixth region. The fourth region can correspond to the first region, the fifth region can correspond to the second region, and the sixth region can correspond to the third region.

In the present invention, the materials of the first material layer and the second material layer are not limited. The first material layer and the second material layer can be any kind of optical films or the combination thereof so as to have different transparency. Preferably, the first material layer or the second material layer is a chromium film or a multilayer film. Thereby, the fourth region, the fifth region and the sixth region have different transparency. Preferably, the transparency value of the fifth region is between those of the fourth region and the sixth region. The mask can be manufactured by the following steps: forming the first material layer in the fourth region; forming the second material layer in the fifth region; and forming neither the first material layer nor the second material layer in the sixth region. Alternatively, the fourth region has neither the first material layer nor the second material layer therein, the fifth region has the second material layer therein, and the sixth region has the first material layer therein. The selection of the aforementioned methods depends on the property of the photoresist layer. Preferably, the fourth region defines the contact hole patterns, and the entirety of the fourth and the fifth regions defines the pixel electrode patterns.

The aforementioned photoresist layer can consist of a resin, a photosensitiser and a solvent in any ratio. Preferably, the type of the first photoresist layer is different from that of the second photoresist layer. For example, the first photoresist layer is a positive photoresist while the second photoresist layer is a negative photoresist, or the first photoresist layer is a negative photoresist while the second photoresist layer is a positive photoresist.

Part of the metal layer can be disposed in the first region. After completion of the first exposure process, part of the first photoresist layer in the first region can absorb sufficient energy so as to perform a process for development and etching to remove part of the first photoresist layer in the first region and thereby form contact hole patterns while parts of the first photoresist layer in the second and third regions cannot meet the requirement for being removed thoroughly. The sufficient absorption of light energy is required for removing thoroughly a positive photoresist while the insufficient absorption of light energy is required for removing thoroughly a negative photoresist. Thereby, after the development process, the second region still has a photoresist therein to protect the structure therebelow from being etched in an etching process, and the third region has a thicker photoresist therein than the second region.

In the present invention, the development process is not limited. The development process can use any kind of developer or equipment. The etching process used in the present invention is also not limited. The etching process can be a wet etching process, a dry etching process using plasma, or other processes.

Subsequently, a second exposure process can be performed by the same mask to define the pixel electrode patterns. After completion of the second exposure process using the same mask and the second photoresist layer, part of the second photoresist layer in the third region can be thoroughly removed to form the pixel electrode patterns.

Accordingly, the present invention uses a single mask to form the contact holes and the pixel electrodes rather than use two masks to individually form the contact holes and the pixel electrodes. Thereby, the number of the masks used in the process for manufacturing a flat panel display and the manufacturing cost are reduced.

DETAILED DESCRIPTION OF THE PREFERRED EMBODIMENT

Embodiment 1

FIGS. 2A to 2H show a process for manufacturing a display substrate of a first preferred embodiment of the present invention.

Figure 1A:
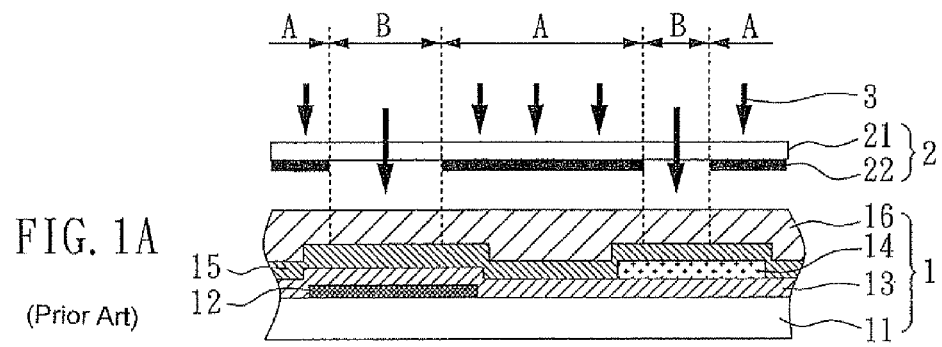
FIGS. 1A to 1H show a conventional process for manufacturing a display substrate.
Figure 1B:
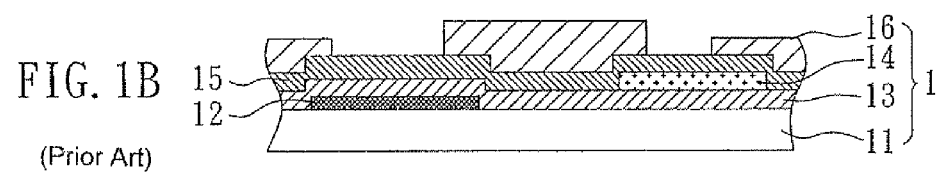
Figure 1C:
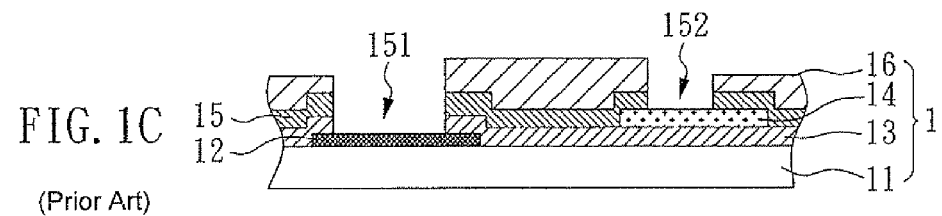
Figure 1D:
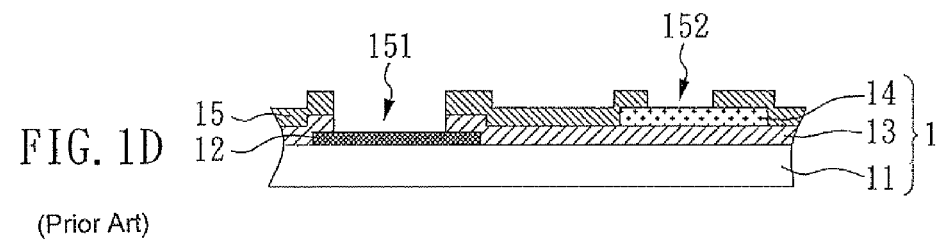
Figure 1E:
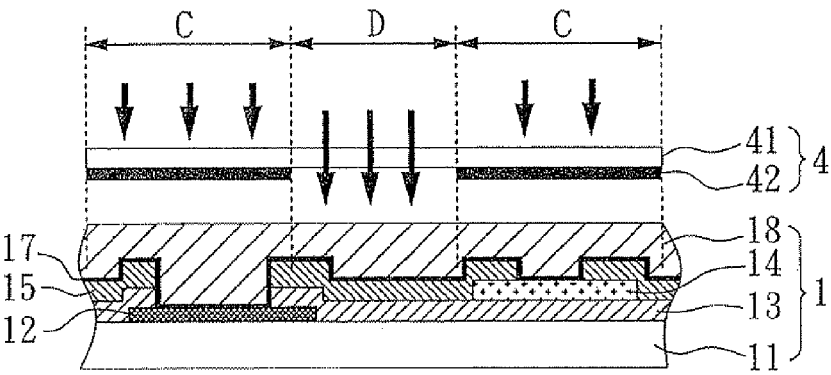
Figure 1F:
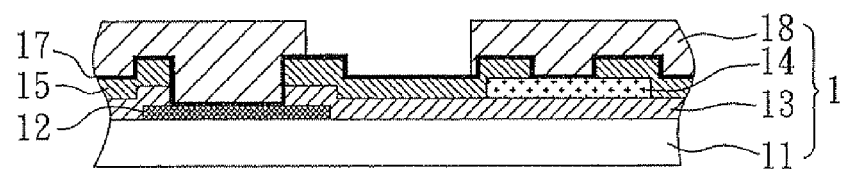
Figure 1G:
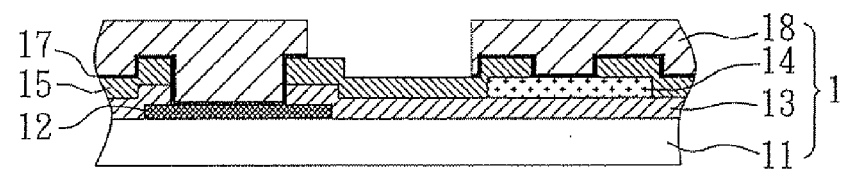
Figure 1H:
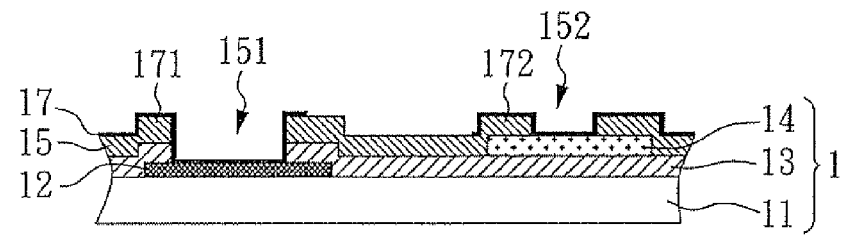
Figure 2A:
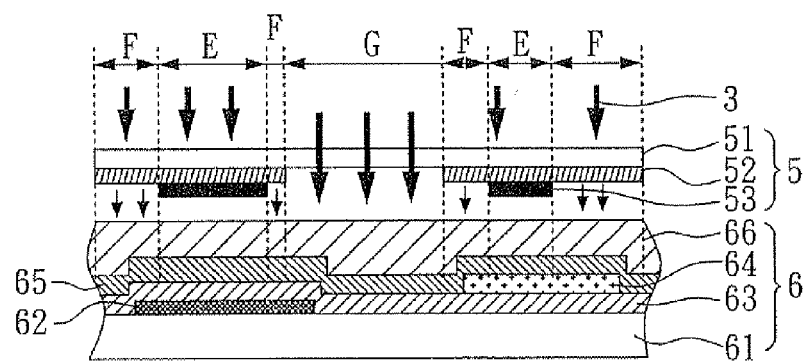
FIGS. 2A to 2H show a process for manufacturing a display substrate in a first embodiment of the present invention.

Please first refer to FIG. 2A. A display substrate 6 is provided, which comprises a source/drain metal layer formed by a conventional third mask process. The display substrate 6 comprises a substrate 61, two metal layers 62, 64 and an insulating layer 63. In the present embodiment, the substrate 61 is made of glass material, the metal layer 62 is a gate metal layer, and the metal layer 64 is a source/drain metal layer. The insulating layer 63 is disposed between the metal layers 62 (gate metal layer) and 64 (source/drain metal layer). The metal layers 62 (gate metal layer), the insulating layer 63 and the metal layer 64 (source/drain metal layer) are formed on the substrate 61 in sequence.

As shown in FIG. 2A, a dielectric layer 65 is first formed on the insulating layer 63 and the metal layer 64. In the present embodiment, the dielectric layer 65 is made of SiNx compounds by chemical vapor deposition to protect the circuit structure therebelow and electrically isolate the circuit structure there below from the circuits there above.

Hereafter, a first photoresist layer 66 is formed on the dielectric layer 65. In the present embodiment, the photoresist layer 66 is a negative photoresist consisting of a resin, a photosensitiser and a solvent. The photoresist layer 66 can absorb light energy to perform polymerization and thus the photoresist layer 66 cannot be removed by a soaking process in a developer.

Subsequently, the display substrate 6 carries out a first exposure process by means of a light source 3 and a halftone mask 5. In the present embodiment, the halftone mask 5 is disposed between the light source 3 and the display substrate 6, and the light source 3 is a uniform directional light source.

The aforementioned halftone mask 5 comprises a substrate 51, a first material layer 53 and a second material layer 52. In the present embodiment, the material of the substrate 51 is quartz with high transparency. Three regions E, F and G are defined by the second material layer 52 and the first material layer 53 of the halftone mask 5. That is, the region where the first material layer 53 is disposed over the substrate 51 is defined as the region E, the region where the second material layer 52 is disposed over the substrate 51 is defined as the region F, and the region where neither the second material layer 52 nor the first material layer 53 over the substrate 51 is defined as the region G. The region E defines contact hole patterns (not shown in FIG. 2A), and the entirety of the regions E and F defines pixel electrode patterns (not shown in FIG. 2A).

In the present embodiment, the second material layer 52 is a chromium film where many fine holes (not shown in FIG. 2A) are formed to adjust the transparency thereof. Thereby, the second material layer 52 can permit part of available light to pass through the halftone mask 5. In the present embodiment, the first material layer 53 is an opaque chromium film and thereby can mask light.

When the light source 3 is shone on the halftone mask 5, the three regions E, F and G are defined on the display substrate 6. Herein, the region E of the first photoresist layer 66 cannot absorb light energy since the light source 3 is masked by the first material layer 53. The region G of the first photoresist layer 66 can absorb light energy to perform polymerization since the light source 3 can pass through the part G of the halftone mask 5. The second material layer 52 exhibits designed transparency, and thereby part of the light source 3 can pass through the region F of the halftone mask 5 to be absorbed by the region F of the first photoresist layer 66 so as to perform polymerization. Thereby, it can be known that the regions E, F and G of the first photoresist layer 66 can individually perform polymerization in different degrees.

Figure 2B:
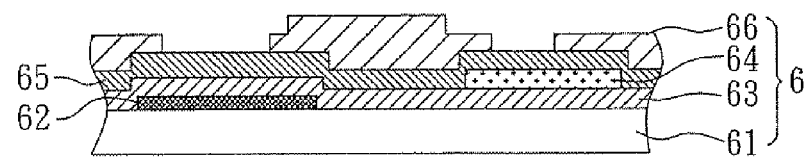

With reference to FIG. 2B, there is shown a cross-section view of a display substrate 6 after completion of the exposure process as shown in FIG. 2A and then a process is performed for removing the first photoresist layer (as shown in FIG. 2A) by a developer (not shown in FIG. 2B). Herein, the kind of the developer depends on the contents concluded in the first photoresist layer 66. After the first photoresist layer 66 has undergone a soaking process in the developer for a period of time, part of the first photoresist layer 66 where the degree of polymerization is low can be dissolved in the developer. Thereby, after completion of the soaking process in the developer, the first photoresist layer 66 has non-uniform thickness due to the various degrees of light absorption in the exposure process. The region G of the first photoresist layer 66 has a larger thickness than the region F of the first photoresist layer 66, and the region E of the first photoresist layer 66 is thoroughly removed to expose the dielectric layer 65. The exposed part of the dielectric layer 65 defines the predetermined contact hole patterns.

Figure 2C:
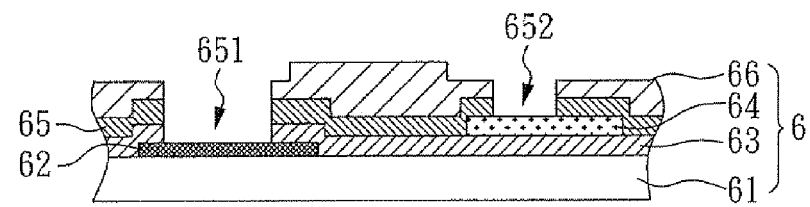

With reference to FIG. 2C, there is shown a cross-section view of a display substrate 6 after completion of both the development process as shown in FIG. 2B and then an etching process. Herein, the suitable method for etching depends on the contents concluded in the dielectric layer 65 and the insulating layer 63. In the present embodiment, the suitable method for etching is wet etching using hydrofluoric acid (HF) (not shown in FIG. 2C) as the etching liquid. After the display substrate 6 has undergone a soaking process in an etching liquid for a period of time, the exposed parts of the dielectric layer 65 and the insulating layer 63 are etched to form contact holes 651 and 652. The part surface of the display substrate 6 having the first photoresist layer 66 can protect itself and the structure there below from being etched during the soaking process. In the etching process, the etching liquid first etches the exposed dielectric layer 65 and the etching depth increases along with the passage of time. By controlling the duration of soaking, the etching endpoints are the metal layers 64 (source/drain metal layer) and 62 (gate metal layer) in the present embodiment.

Figure 2D:
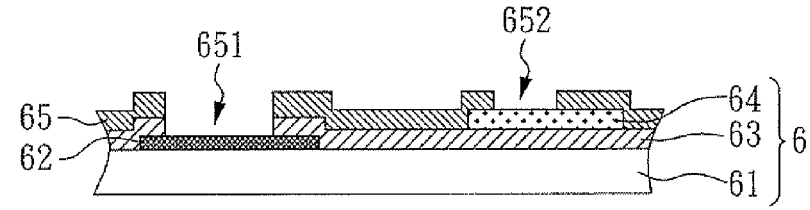

Subsequently, with reference to FIG. 2D, there is shown a cross-section view of a display substrate 6 after the first photoresist layer 66 (as shown in FIG. 2C) is removed. Herein, the first photoresist layer 66 (as shown in FIG. 2C) is dissolved by a soaking process in a photoresist stripper (not shown in FIG. 2D). In the present embodiment, the kind of the photoresist stripper depends on the contents included in the first photoresist layer 66 (as shown in FIG. 2C).

Figure 2E:
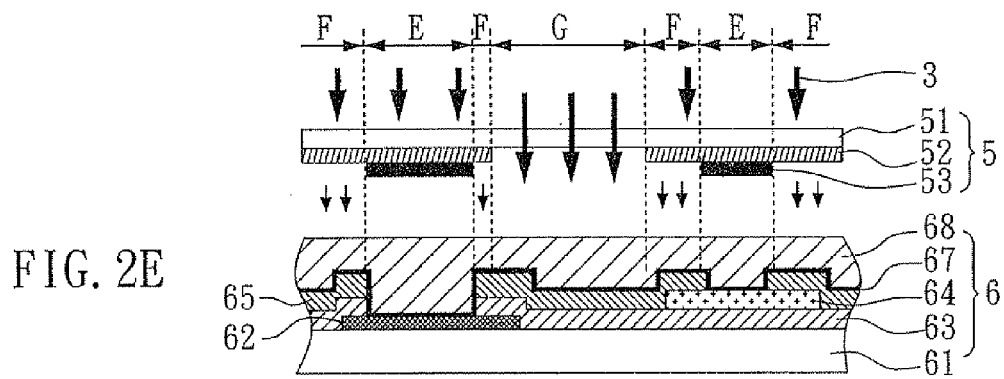

With reference to FIG. 2E, there is shown a second exposure process to form pixel electrodes by a halftone mask 5 after the first photoresist layer 66 (as shown in FIG. 2C) is removed. As shown in FIG. 2E, an electrode layer 67 is first formed on the dielectric layer 65 and the metal layers 62 and 64, and then a second photoresist layer 68 is formed on the electrode layer 67. In the present embodiment, the electrode layer 67 is formed by depositing indium titanium oxide (ITO) on the dielectric layer 65 and the metal layers 62 and 64 through physical vapor deposition. Thereby, the electrode layer 67 electrically connects to the metal layer 64 (source/drain metal layer) or 62 (gate metal layer) there below in the contact holes 651 and 652. In the present embodiment, the kind of the second photoresist layer 68 is different from that of the first photoresist layer 66 (as shown in FIG. 2C). That is, the second photoresist layer 68 is a positive photoresist that can absorb light energy to perform decomposition.

As shown in FIG. 2E, in the second exposure process similar to the first exposure process, the regions E, F and G of the second photoresist layer 68 absorbs different intensity of light due to the difference of transparency in the regions E, F and G of the halftone mask 5. Thereby, the region G of the second photoresist layer 68 performs decomposition, the region F of the second photoresist layer 68 performs partial decomposition, and the region G of the second photoresist layer 68 remains in the initial state.

Figure 2F:
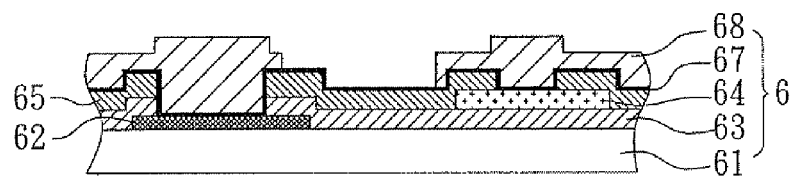

With reference to FIG. 2F, there is shown a cross-section view of a display substrate 6 after a soaking progress in a developer to remove part of the second photoresist layer 68. Herein, the suitable developer depends on the contents concluded in the second photoresist layer 68. After the second photoresist layer 68 has undergone a soaking process in the developer for a period of time, part of the second photoresist layer 68 where the degree of decomposition is high can be dissolved in the developer. Thereby, after the development, the region E of the second photoresist layer 68 has a larger thickness than the region F of the second photoresist layer 68, and the region G of the second photoresist layer 68 is removed. The regions E and F of the second photoresist layer 68 define the pixel electrode patterns.

Figure 2G:
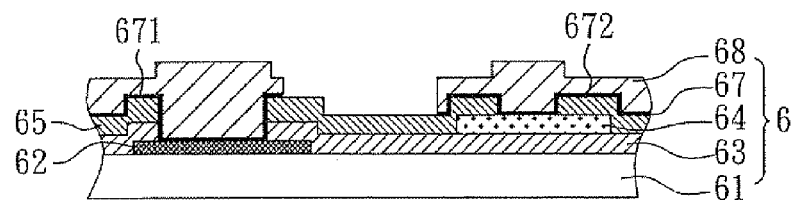

With reference to FIG. 2G, there is shown a cross-section view of a display substrate 6 after the electrode layer 67 is etched to form pixel electrodes 671 and 672. Herein, the suitable method for etching depends on the contents included in the electrode layer 67. In the present embodiment, the method for etching is wet etching that uses oxalic acid as an etching liquid (not shown in FIG. 2G). In the soaking process in the etching liquid, the region G of the electrode layer 67 is etched by the etching liquid. The second photoresist layer 68 protects the part of the electrode layer 67 therebelow from being etched, and then the pixel electrodes 671 and 672 are formed.

Figure 2H:
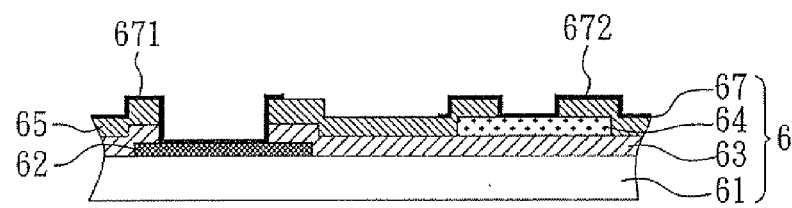

With reference to FIG. 2H, there is shown a cross-section view of a display substrate 6 after the second photoresist layer 68 shown in FIG. 2G is removed. Herein, the display substrate 6 is accomplished by a soaking process in a photoresist stripper (not shown in FIG. 2H) to thoroughly dissolve the second photoresist layer 68 shown in FIG. 2G. The suitable photoresist stripper depends on the contents included in the second photoresist layer 68 shown in FIG. 2G. The present embodiment merely uses a halftone mask to form the contact holes and the pixel electrodes. Thereby, the cost incurred in the masks can be reduced, resulting in the reduction of cost for manufacturing a flat panel display.

Embodiment 2

FIGS. 3A to 3F show a process for manufacturing a display substrate of a second preferred embodiment of the present invention.

Figure 3A:
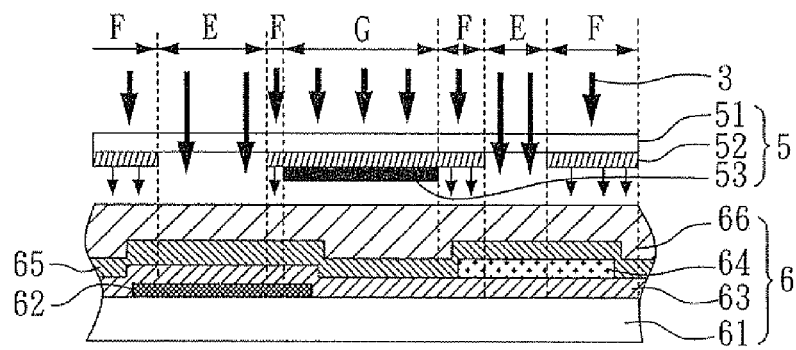
FIGS. 3A to 3F show a process for manufacturing a display substrate in a second embodiment of the present invention.
Figure 3B:
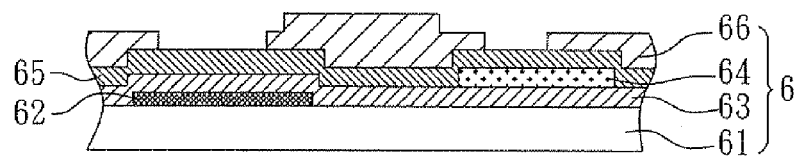
Figure 3C:
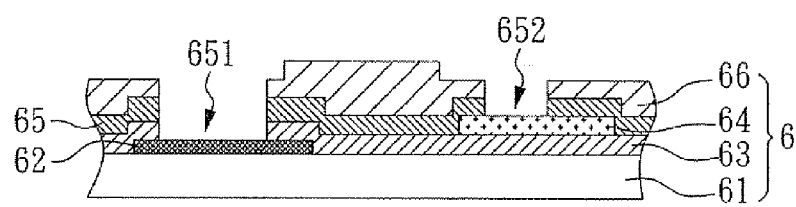

Please refer to FIGS. 3A to 3C. The process shown in FIGS. 3A to 3C is the same as that shown in FIGS. 2A to 2C of Embodiment 1 except that the material of the first photoresist layer 66 is a positive photoresist, the first material layer 53 of the halftone mask 5 is disposed in the region G, and neither the second material layer 52 nor the first material layer 53 is disposed in the region E. After the process shown in FIGS. 3A to 3C is completed, the contact holes 651 and 652 of the display substrate 6 is manufactured.

Figure 3D:
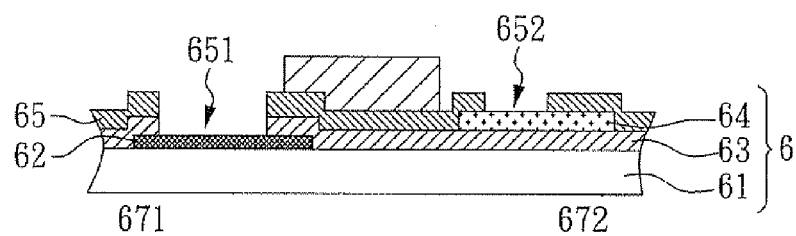

With reference to FIG. 3D, there is shown a process next to FIG. 3C. In the process, a plasma ashing process is performed to partly remove the first photoresist layer 66 by the impact of plasma. In the present embodiment, the region F of the first photoresist layer 66 is removed to expose the metal layers 62 (gate metal layer) and 64 (source/drain metal layer) in the region E and the dielectric layer 65 in the region F by controlling the time for plasma ashing. The aforementioned exposed parts define the pixel electrode patterns.

Subsequently, with reference to FIG. 3E, there is shown a cross-section view of a display substrate 4 after completion of both the above-mentioned plasma ashing process and then a process for depositing an electrode layer 67. Herein, the electrode layer 67 is formed by sputtering indium titanium oxide on the surface of the display substrate 6. Thereby, the exposed surface of the display substrate 6 has pixel electrodes 671 and 672 formed thereon.

Figure 3E:
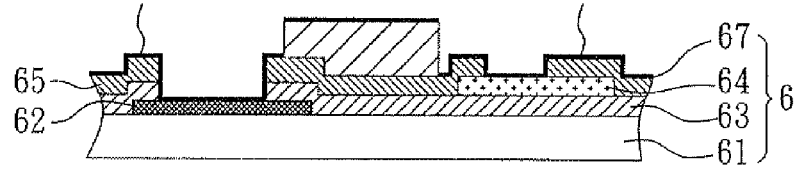
Figure 3F:
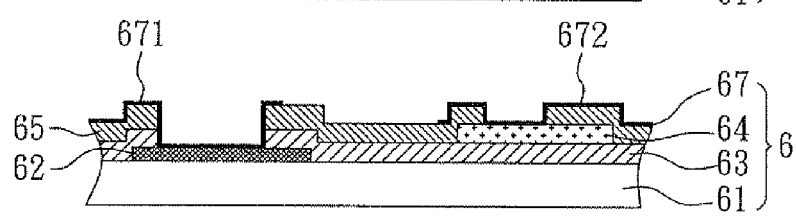

With reference to FIG. 3F, there is shown a cross-section view of a display substrate 6 after completion of a process for removing the first photoresist layer 66 shown in FIG. 3E. Herein, the region G of the first photoresist layer 66 shown in FIG. 3E is removed by a lift-off process. The present embodiment merely uses a halftone mask to form the contact holes and the pixel electrodes. In addition, the present embodiment uses fewer steps for exposure, development and etching and thereby incurs lower cost than Embodiment 1. Accordingly, in addition to the reduction of the cost incurred in the masks due to the decrease in the number of the masks, the present embodiment can further reduce the manufacturing time, the cost for personnel and materials, and thereby the cost for manufacturing a flat display device.

In conclusion, the present invention defines different parts in a mask based on transparency so as to use the mask in an exposure process to simultaneously form contact holes and pixel electrodes of a display substrate. Accordingly, the number of the masks required in the process for manufacturing a flat panel display can be reduced, and thereby the object to reduce the manufacturing cost is realized.

Although the present invention has been explained in relation to its preferred embodiment, it is to be understood that many other possible modifications and variations can be made without departing from the scope of the invention as hereinafter claimed.

What is claimed is:

1. A method for manufacturing a flat panel display, employed on a display substrate comprising a metal layer, a dielectric layer and an insulating layer disposed between the metal layer and the dielectric layer and comprising the following steps:
    forming a photoresist layer on the display substrate;
    performing a first exposure process on the photoresist layer by a mask to define a first region, a second region and a third region on the display substrate;
    removing part of the photoresist layer in the first region;
    etching part of the dielectric layer in the first region;
    removing part of the photoresist layer in the second region;
    forming an electrode layer on the display substrate; and
    removing the remained photoresist layer; and
    wherein the mask comprises a substrate, a first material layer and a second material layer, the first material layer and the second material layer are disposed on the substrate to define a fourth region, a fifth region and a sixth region, the fourth region corresponds to the first region, the fifth region corresponds to the second region, and the sixth region corresponds to the third region.

2. The method for manufacturing a flat panel display according to claim 1, wherein the fourth region, the fifth region and the sixth region have different transparency to each other.

3. The method for manufacturing a flat panel display according to claim 1, wherein the mask is a halftone mask.

4. The method for manufacturing a flat panel display according to claim 1, wherein the material of the photoresist layer is a positive photoresist.

5. The method for manufacturing a flat panel display according to claim 1, wherein the material of the photoresist layer is a negative photoresist.

6. The method for manufacturing a flat panel display according to claim 1, wherein part of the metal layer is disposed in the first region.

7. The method for manufacturing a flat panel display according to claim 1, wherein part of the photoresist layer in the second region is removed by a plasma asking process.

8. The method for manufacturing a flat panel display according to claim 1, wherein part of the photoresist layer in the third region is removed by a lift-off process.

9. The method for manufacturing a flat panel display according to claim 1, further comprising a step for removing part of the insulating layer in the first region before removing part of the photoresist layer in the second region.

* * * * *